US008318547B1

(12) United States Patent
Spurlock et al.

(10) Patent No.: US 8,318,547 B1
(45) Date of Patent: Nov. 27, 2012

(54) INTEGRATED CIRCUIT PACKAGE WITH ELECTRICALLY ISOLATED LEADS

(75) Inventors: Brett Alan Spurlock, Los Altos, CA (US); Carlo Melendez, Milpitas, CA (US); Bo Soon Chang, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/568,599

(22) Filed: Sep. 28, 2009

Related U.S. Application Data

(63) Continuation of application No. 11/403,409, filed on Apr. 12, 2006, now Pat. No. 7,608,914.

(51) Int. Cl.
*H01L 21/00* (2006.01)
(52) U.S. Cl. ........................................ 438/123; 438/124
(58) Field of Classification Search .................. 438/123, 438/124
See application file for complete search history.

(56) References Cited

U.S. PATENT DOCUMENTS

| 6,762,485 B2 | 7/2004 | Jiang et al. | |
|---|---|---|---|
| 2007/0051877 A1* | 3/2007 | Sakai et al. | 250/214 R |
| 2008/0036034 A1* | 2/2008 | Juskey et al. | 257/531 |

FOREIGN PATENT DOCUMENTS

CN  200580022458.6  6/2007

OTHER PUBLICATIONS

U.S. Appl. No. 11/403,409 "Integrated Circuit Package With Electrically Isolated Leads," Cao, Phat X et al., filed Apr. 12, 2006; 25 pages.
Lead Frames or Leadframes, webpage [online] [retrieved on Jan. 5, 2006][4 sheets], retrieved from the internet: http://www.semiconfareast.com/leadframes.htm.
Patent Office of the People's Republic of China—First Office Action of China Application No. 200580022458.6 dated Feb. 15, 2008; 9 pages.
USPTO Final Rejection for U.S. Appl. No. 11/403,409 dated Dec. 11, 2008; 8 pages.
USPTO Non-Final Rejection for U.S. Appl. No. 11/403,409 dated Jun. 12, 2008; 5 pages.
USPTO Notice of Allowance for U.S. Appl. No. 11/403,409 dated Feb. 25, 2009; 6 pages.
USPTO Notice of Allowance for U.S. Appl. No. 11/403,409 dated Jun. 19, 2009; 6 pages.
USPTO Requirement for Restrictions for U.S. Appl. No. 11/403,409 dated Mar. 28, 2008; 6 pages.

* cited by examiner

*Primary Examiner* — Phat X Cao

(57) ABSTRACT

In one embodiment, an integrated circuit package includes a lead frame with a die paddle and several leads. Portions of the lead frame not having an external electrical connection may be thinned such that they may be encapsulated by an electrically insulating packaging material on the back of the lead frame. Portions of the lead frame having external electrical connections may have a thickness such that they are exposed through the packaging material. The lead frame may be covered by an electrically insulating cover to protect components on the lead frame from erroneous electrical contact or electrostatic discharge (ESD) damage.

17 Claims, 6 Drawing Sheets

INTEGRATED CIRCUIT PACKAGE WITH ELECTRICALLY ISOLATED LEADS

CROSS-REFERENCE TO RELATED APPLICATION

This application is a continuation of U.S. application Ser. No. 11/403,409, filed Apr. 12, 2006.

TECHNICAL FIELD

The present disclosure relates generally to integrated circuits, and more particularly but not exclusively to integrated circuit packaging.

BACKGROUND OF THE INVENTION

As is well known, an integrated circuit may be fabricated on a die on a semiconductor wafer. The semiconductor wafer may include several dies that are individually separated during a dicing process. Each die is then packaged to protect the die from environmental conditions and during handling, and to allow the die to be mounted on a printed circuit board or another substrate. In a typical packaging process, a lead frame is employed to support the die and to allow electrical connection to the die from the outside world. The lead frame consists of a die paddle on which the die is mounted and leads, which provide external electrical connections to the die. The leads may be electrically connected to the die by wire bonding, for example.

Some integrated circuits may be susceptible to erroneous electrical contact, electrostatic discharge (ESD) damage, or both. Unfortunately, currently available integrated circuit packages do not adequately address the need to protect an integrated circuit from erroneous electrical contact or ESD damage.

SUMMARY

In one embodiment, an integrated circuit package includes a lead frame with a die paddle and several leads. Portions of the lead frame not having an external electrical connection may be thinned such that they may be encapsulated by an electrically insulating packaging material on the back of the lead frame. Portions of the lead frame having external electrical connections may have a thickness such that they are exposed through the packaging material. The lead frame may be covered by an electrically insulating cover to protect components on the lead frame from erroneous electrical contact or ESD damage.

These and other features of the present invention will be readily apparent to persons of ordinary skill in the art upon reading the entirety of this disclosure, which includes the accompanying drawings and claims.

Figure 1A:
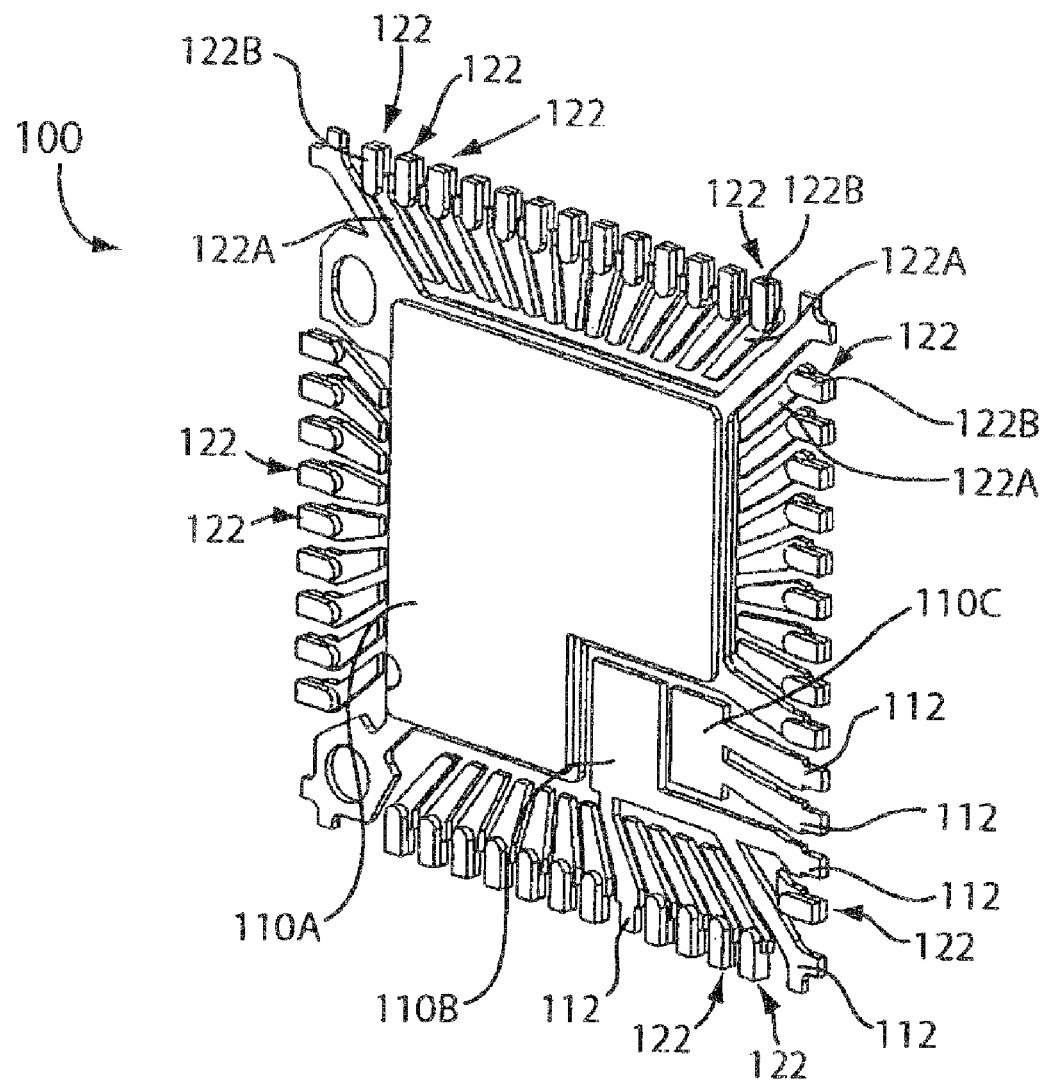
FIGS. 1A, 1B, and 1C show various views of a lead frame in accordance with an embodiment of the present invention.

The use of the same reference label in different drawings indicates the same or like components. Some components that appear several times in a single drawing are not all labeled to avoid cluttering the drawing.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1B:
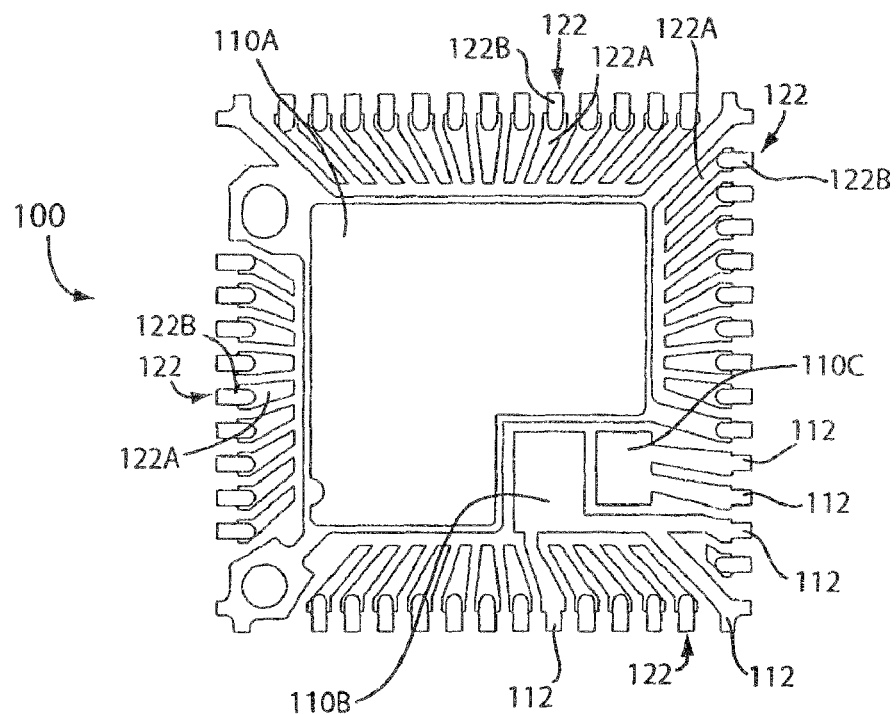
Figure 1C:
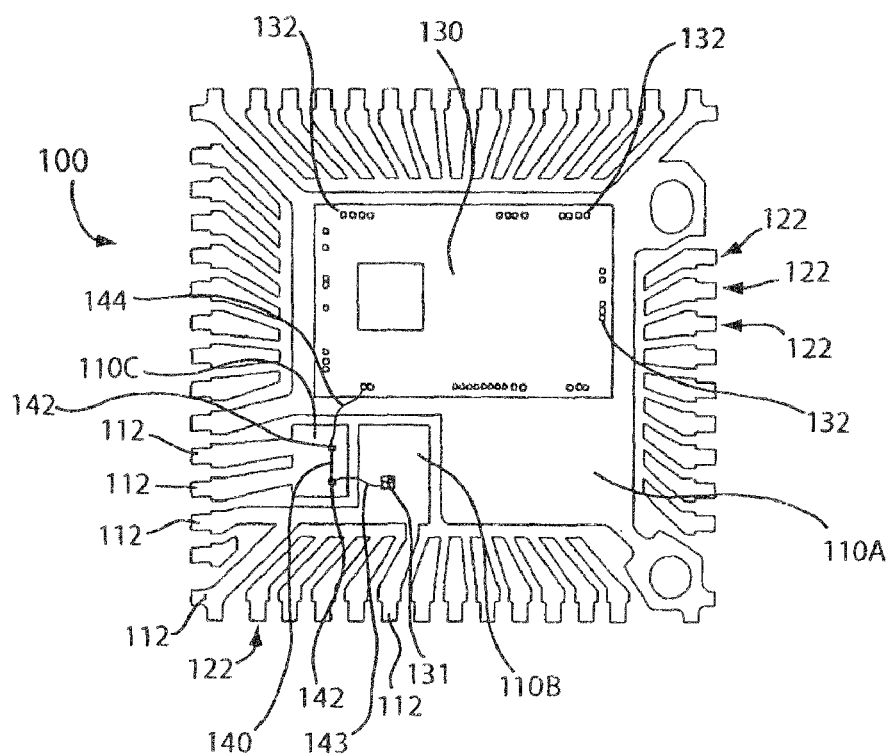

FIGS. 1A, 1B, and 1C show various views of a lead frame 100 in accordance with an embodiment of the present invention. FIG. 1A shows a three-dimensional back view of the lead frame 100. In the example shown, the lead frame 100 includes a die paddle and leads. The die paddle comprises die paddle portions 110A, 110B, and 110C, while the leads comprise leads 122 and 112. The die paddle portions 110A, 110B, and 110C are also collectively referred to as "die paddle 110." In one embodiment, the die paddle 110 is physically separated into portions 110A, 110B, and 110C for electrical and mechanical isolation. As shown in FIG. 1A, a lead 122 may comprise an exposed portion 122B and an isolated portion 122A. As will be more apparent below, the exposed portions 122B are exposed on the back of the device after encapsulation (e.g., molding) to allow for external (i.e., from outside the device) electrical connections to the device (e.g., see FIG. 2B). The isolated portion 122A may be completely buried by the encapsulant (e.g., molding compound) on the back of the device for electrical and environmental isolation. Note that only some of the leads 122 have been labeled in FIGS. 1A, 1B, and 1C for the r clarity of illustration.

Figure 2A:
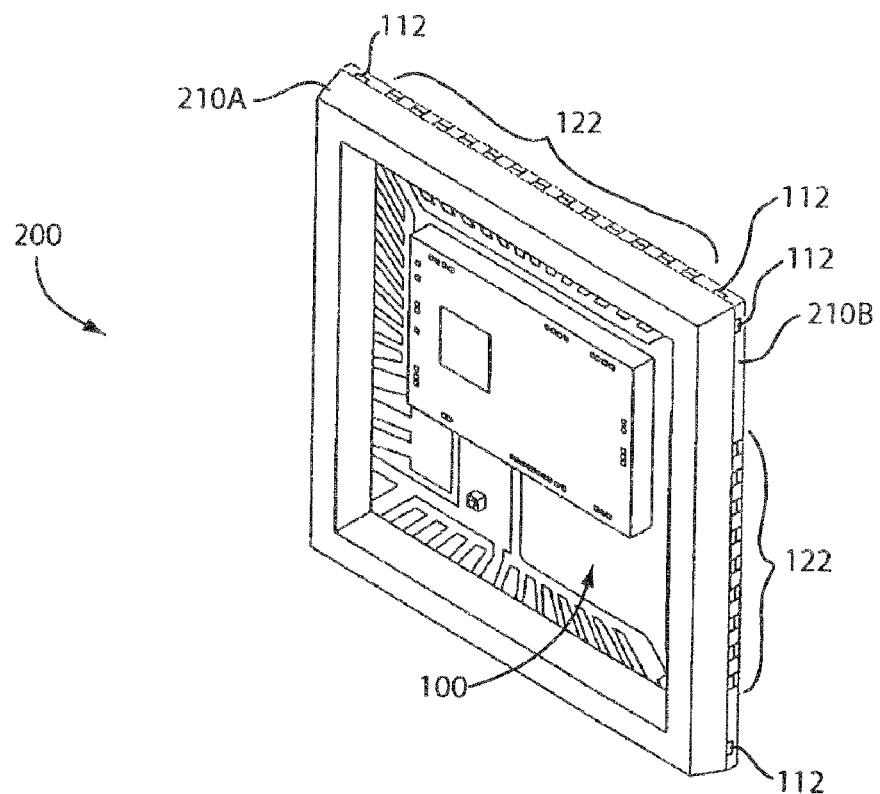
FIGS. 2A and 2B show three-dimensional views of the lead frame of FIGS. 1A, 1B, and 1C after encapsulation.
Figure 2B:
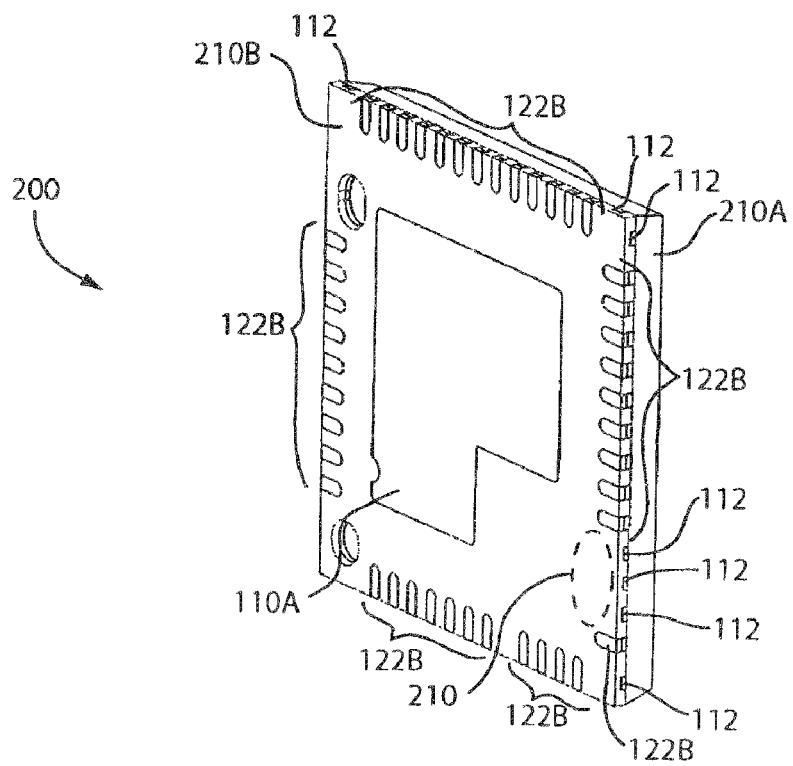

Still referring to FIG. 1A, the buried leads 112 are so named because they do not have an exposed portion on the back of the device even after encapsulation (e.g., see FIG. 2B). That is, the buried leads 112 are completely buried under the encapsulant, such as molding compound or other packaging material, on the back of the device. This advantageously allows the buried leads 112 and components electrically coupled to the buried leads 112 to be electrically isolated from the back of the device after packaging.

As is conventional, the leads 122 and 112 are attached to the lead frame with other leads during the manufacture of the lead frame 100. The leads from the lead frame 100 are trimmed after dice attach and wire bonding. In one embodiment, the die paddle 110 is physically separated into portions 110A, 110B, and 110C for external electrical and mechanical isolation. In one embodiment, the die paddle portion 110C has no external electrical connection. Buried leads 112, rather than leads 122, are thus formed with the die paddle portion 110C. Similarly, the die paddle portion 110B has no external electrical connection, and accordingly employs buried leads 112.

In one embodiment, components of the lead frame 100 that have no external electrical connection are thinned to prevent them from sticking out of the back of the device after encapsulation. Accordingly, the buried leads 112, the isolated portions 122A of the leads 122, the die paddle portion 110B, and the die paddle portion 110C may be thinned such that they do not stick out on the back of the device after molding, for example. In one embodiment, the buried leads 112, the isolated portions 122A of the leads 122, the die paddle portion 110B, and the die paddle portion 110C are thinned by half-etching. For example, assuming a lead frame comprising copper with an original thickness of about 200 µm, the buried leads 112, the isolated portions 122A of the leads 122, the die paddle portion 110B, and the die paddle portion 110C may be etched to a thickness of about 100 µm. In this example, the exposed portions 122B of the leads 122 and the die paddle portion 110A are not thinned (i.e., not etched) to allow for external electrical connections on the back of the device even after encapsulation. That is, the exposed portions 122B of the leads 122 and the die paddle portion 110 may be left at a thickness of about 200 µm. The half etching thus results in each lead 122 having two thicknesses, with the portion 122B thicker than the portion 122A. In other words, the half etching allows the leads 122 to have a stepped profile. The encapsulant (e.g., molding compound) may be formed to fit against the sidewalls of this stepped profile and the sidewalls of the die paddle portion 110A for structural stability.

In one embodiment, the buried leads 112 are not physically separated from their respective die paddle portions. That is, the buried leads 112 may form a single piece with a thinned die paddle portion. This advantageously provides more structural support to the die paddle portions 110B and 110C, for example.

In one embodiment, the lead frame 100 has a dimensions of 8 mm×8 mm with a thickness of about 100 µm at the thinned portions (i.e., buried leads 112, die paddle portions 110B and 110C, and isolated portions 122A of leads 122) and a thickness of about 200 µm at the non-thinned portions (i.e., exposed portions 122B of leads 122 and die paddle portion 110A).

FIG. 1B shows a layout view of the back of the lead frame 100. In one embodiment, the back of the lead frame 100 directly faces the substrate (e.g., printed circuit board) on which the finished, packaged device is mounted. The features on the back of the lead frame 100 have already been explained in connection with FIG. 1A. Reference labels are shown in FIG. 1B for ease of matching with features shown in FIG. 1A.

FIG. 1C shows a layout view of the front of the lead frame 100. The front of the lead frame 100 is also referred to as "component side" because that is the side of the lead frame 100 where components are mounted. In the example of FIG. 1C, a component 130 is mounted on the die paddle portion 110A. Generally speaking, a component may be mounted on a die paddle using an appropriate adhesive. In one embodiment, the component 130 comprises an integrated circuit die. Multiple bond pads 132 serve as nodes for making electrical connections to the component 130. Electrical connections between the leads 122 and die paddle portion 110A may be over wires formed using a wire bonding process, for example. Note that only some of the bond pads 132 are labeled for clarity of illustration.

In the example of FIG. 10, a component 131 is mounted on the die paddle portion 110B. In one embodiment where the device that includes the lead frame 100 is for an optical application, the component 131 comprises a vertical cavity surface emitting laser (VCSEL). In this example, the component 131 does not have any external electrical connection. Accordingly, to protect the component 131 from inadvertent electrical contact or electro-static discharge damage (ESD), the die paddle portion 110B is formed as a single piece with buried leads 112. As mentioned, the die paddle portion 110B and the buried leads 112 may be thinned such that they can be buried under an electrically isolating packaging material, such as molding compound.

In the example of FIG. 1C, the die paddle portion 110C is a floating die paddle in that it does not have any external electrical connection or active component mounted on it. In one embodiment, the die paddle portion 110C only includes wiring components, such as one or more interconnect lines 140 and nodes 142. That is, the die paddle portion 110C may be used solely for routing electrical connections from one die paddle portion to another to get around physical obstructions and minimize grounding issues, for example. In the example of FIG. 1C, the component 131 is electrically coupled to the component 130 by way of wire 143 (e.g., bond wire), nodes 142, interconnect line 140, and wire 144.

FIGS. 2A and 2B show three-dimensional views of the lead frame 100 after encapsulation. In one embodiment, the encapsulation comprises a molding process. Accordingly, the encapsulated lead frame 100 is also referred to herein as "molded assembly 200." FIG. 2A shows the top of the molded assembly 200, while FIG. 2B shows the back of the molded assembly 200. In one embodiment, the molding process involves applying a molding compound (or other suitable electrically insulating packaging material) on the back and front of the lead frame 100. In one embodiment, the molding compound comprises the following principal compound constituents: epoxy resin, inert filler, curing agent/hardener, accelerator, mold release agent, coupling agents, stress relief additive, flame retardant, and coloring agent. In the example of FIG. 2A, the molding process results in the formation of a molding 210A on the front of the lead frame 100 and a molding 210B on the back of the lead frame 100. The molding 210A may be formed only along the perimeter of the lead frame 100 due to the thickness of the lead frame, mold tooling architecture, and molding process. The molding 210B on the back of the lead frame 100 fills the gaps between the die paddle portions and the leads. FIG. 2A shows portions of the leads 122 and 112 sticking out of the sides of the molding 210B. As will be more apparent below, a cover may be used to advantageously cover the sides and top of the molded assembly 200 to protect its components from erroneous electrical contact and ESD damage.

As shown in FIG. 2B, the molding 210B buries the back of the lead frame 100 such that the thinned out portions of the lead frame 100 do not stick out of the back. In the example of FIG. 2B, the molding 210B is formed such that the die paddle portion 110A and the exposed leads 122B of the leads 122 are exposed. This allows electrical connections to be made to the die paddle portion 110A (e.g., ground) and the exposed leads 122B from the back of the molded assembly 200. Portions of the lead frame 100 that do not have external electrical connections are electrically isolated from the back of the molded assembly 200 by the molding compound. For example, the leads 112 are not exposed on the back of the molded assembly 200 (e.g., see the area marked with dashed line 210). Also, note that the die paddle portions 110B and 110C are not visible from the back of the molded assembly 200.

Figure 3C:
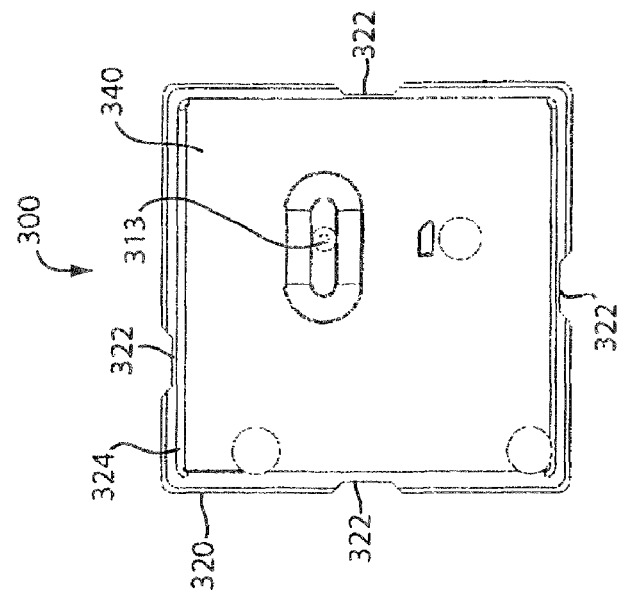
FIGS. 3A, 3B, and 3C show various views of an electrically insulating cover in accordance with an embodiment of the present invention.
Figure 3B:
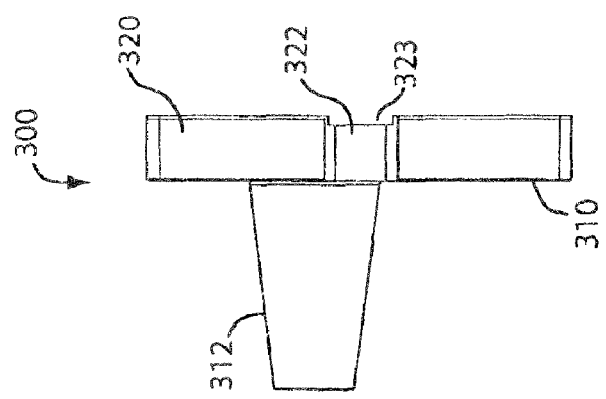
Figure 3A:
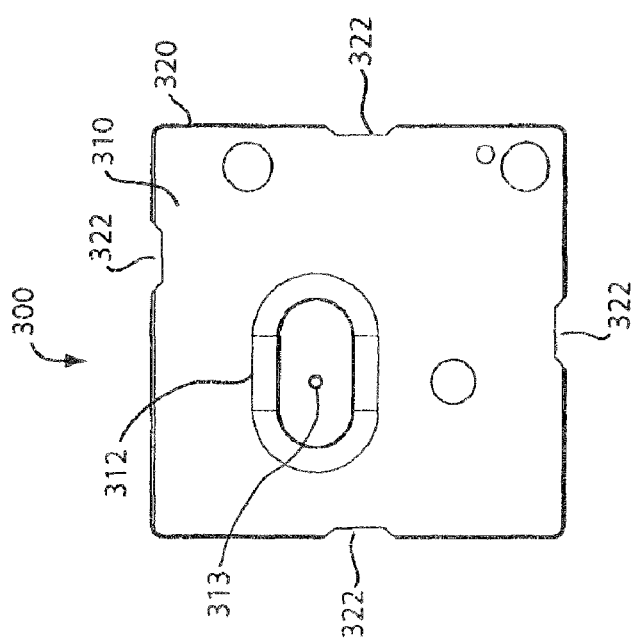

FIGS. 3A, 3B, and 3C show various views of an electrically insulating cover 300 in accordance with an embodiment of the present invention. As will be more apparent below, the cover 300 may be employed to cover the top and side surfaces of the molded assembly 200 for electrical isolation. The cover 300 does not cover the back of the molded assembly 200, allowing exposed portions on the back of the lead frame 100 to make electrical connections with the outside world. In one embodiment, the cover 300 comprises liquid crystal polymer (LCP). Other electrically insulating material may also be employed without detracting from the merits of the present invention.

FIG. 3A shows a top view of the cover 300. The cover 300 may include alignment notches 322 on the side surfaces 320. The alignment notches 322 allow the cover 300 to be secured in alignment with an external surface (not shown). In one embodiment, each notch 322 allows the exposed portions 122B of some of the leads 122 to stick out of the sides of the cover 300 for external electrical connections. In the example of FIG. 3A, a protrusion 312 extends from the top surface 310 (see FIG. 3B). The protrusion 312 mates with an external surface (not shown) for mechanical alignment. In one embodiment, a laser beam projects out of an aperture 313 of the protrusion 312 during normal operation. For example, a laser output of the component 131 (e.g., a VCSEL) may be optically routed to the aperture 313 using a fiber optic wire.

FIG. 3B shows a side view of the cover 300. A shown in FIG. 3B, a notch 322 on a side surface 320 may include a window 323 through which exposed portions 122B of leads 122 may protrude (see FIG. 5) for external electrical contact. FIG. 3B also shows the previously discussed protrusion 312 extending from the top surface 310.

FIG. 3C shows a bottom view of the cover 300. FIG. 3C shows the previously discussed aperture 313 and alignment notches 322 on the sides 320. FIG. 3C also shows a bottom surface 340 and a lip 324. When the cover 300 is used to enclose a molded assembly 200 (see FIGS. 4 and 5), the molded assembly 200 press fits onto the lip 324 with the molding 210A mating against the bottom surface 340. As is evident from FIG. 3C, the back of the molded assembly 200, and hence the non-thinned portions of the lead frame 100, are not covered by the cover 300.

Figure 4:
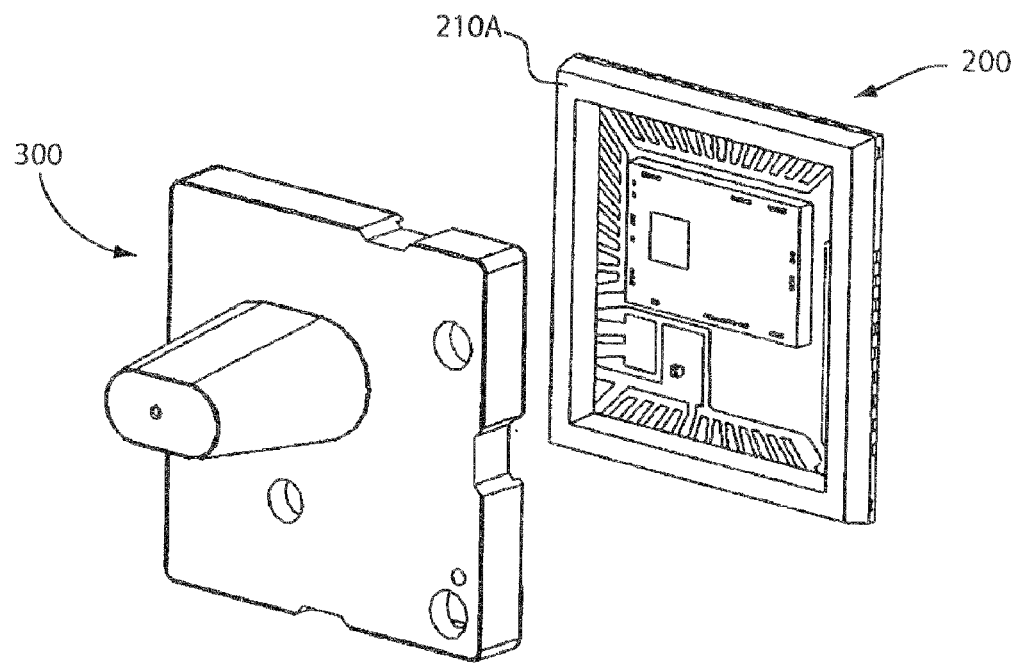
FIG. 4 shows a three-dimensional view of a cover and a molded assembly in accordance with an embodiment of the present invention.

FIG. 4 shows a three-dimensional view of the cover 300 and the molded assembly 200 prior to being joined together. The cover 300 may be used to enclose the front and side portions of the molded assembly 200. Accordingly, the molding 210A faces the bottom surface of the cover 300 when joined together.

Figure 5:
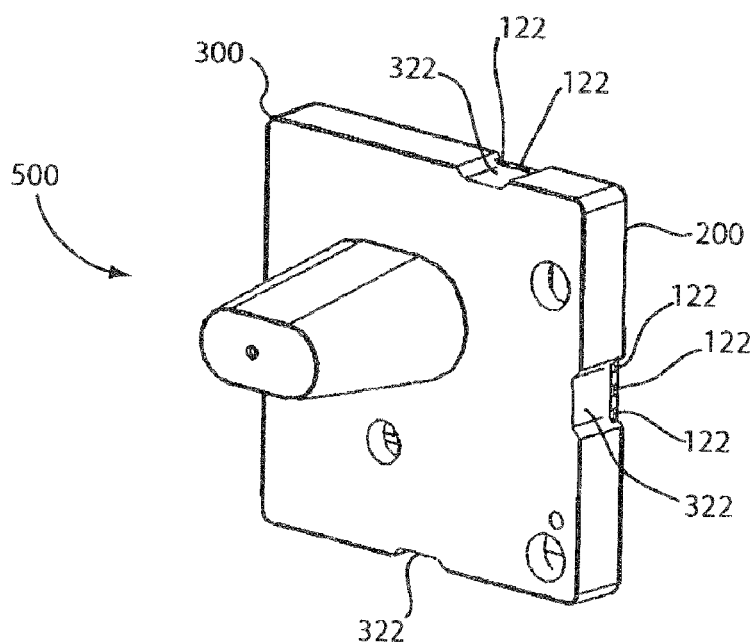
FIG. 5 shows a three-dimensional view of a packaged device in accordance with an embodiment of the present invention.

FIG. 5 shows a three-dimensional view of a packaged device 500, which comprises the joined cover 300 and the molded assembly 200, in accordance with an embodiment of the present invention. As previously discussed, leads 122 may stick out through a window (see window 323 in FIG. 3B) of an alignment notch 322 for external electrical connections. Buried leads 112 and other portions of the molded assembly 200 are covered by the cover 300 on the top and sides for electrical isolation. In one embodiment, the cover 300 does not cover the back of the molded assembly 200. This allows external electrical connections to be made on the back of the molded assembly 200.

Figure 6:
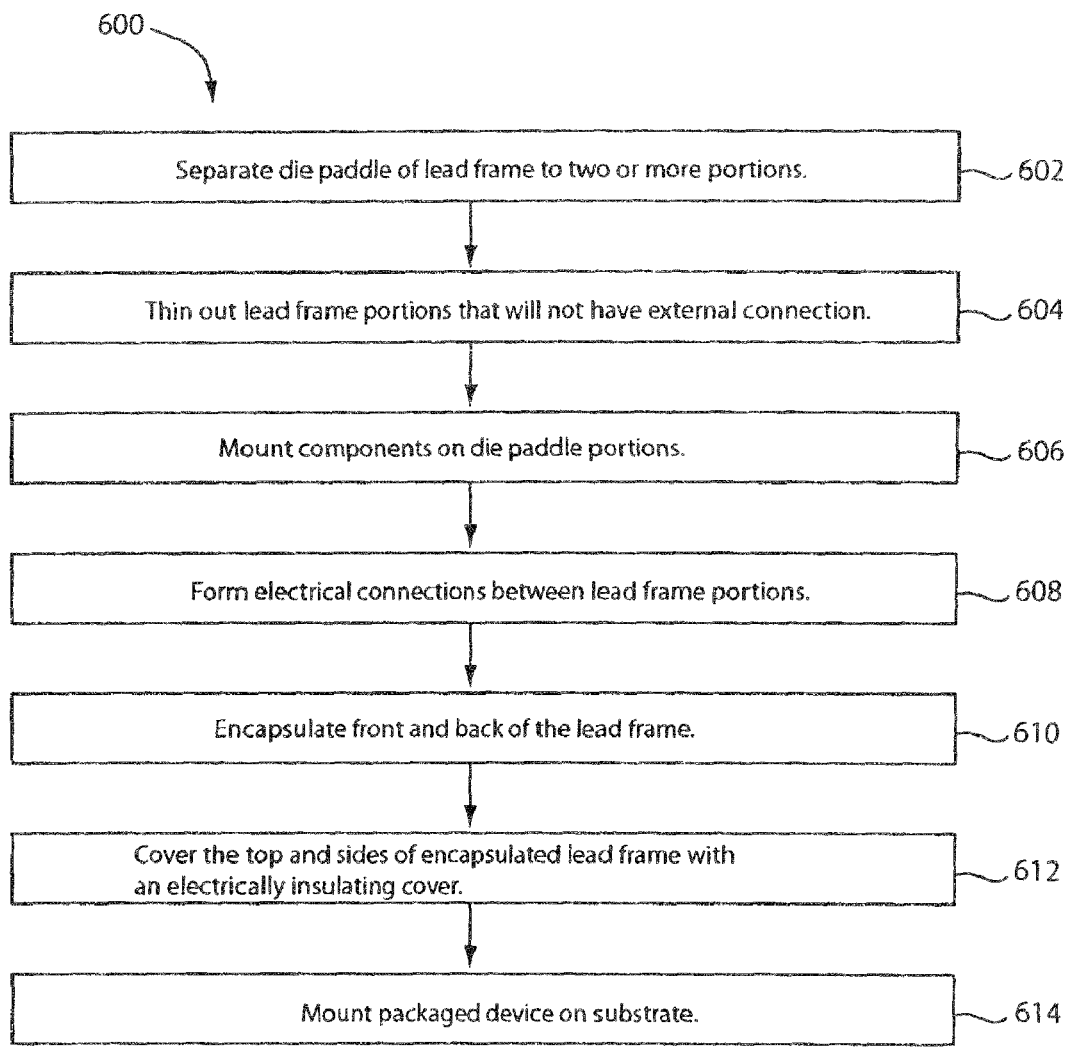
FIG. 6 shows a flow diagram of a method of packaging an integrated circuit in accordance with an embodiment of the present invention.

Referring now to FIG. 6, there is shown a flow diagram of a method 600 of packaging an integrated circuit in accordance with an embodiment of the present invention. The method 600 may be employed to package an integrated circuit die using a lead frame comprising a die paddle and several leads. In one embodiment, the lead frame comprises copper having a starting uniform thickness of about 200 μm.

In step 602, a die paddle is separated into two or more portions. For example, a die paddle may comprise physically separate first, second, and third die paddle portions.

In step 604, lead frame portions that will not have external electrical connections are thinned such that they are not exposed on the back of the lead frame after the lead frame has been encapsulated (e.g., by molding). In one embodiment, such portions of the lead frame are thinned by half-etching. That is, half of the original thickness of such portions may be removed using a suitable conventional etching process. For example, assuming a copper lead frame with a starting uniform thickness of about 200 μm, lead frame portions that will not have external electrical connections may be thinned to about 100 μm. This allows them to be buried under a packaging material, while the non thinned portions of the lead frame remain exposed. For example, a second die paddle portion where a component that will not have external electrical connection is mounted and the second die paddle portion's leads may be thinned by half-etching. As another example, a third die paddle portion that will be used solely to route internal electrical signals (i.e., a floating die paddle portion) and its associated leads may also be thinned by half-etching.

One or more components that will have external electrical connections may be mounted on a first die paddle portion. The first die paddle portion and its associated leads are not thinned to allow them to be exposed through the subsequently formed packaging material on the back of the lead frame.

In step 606, components are mounted on die paddle portions. In one embodiment, an integrated circuit die is mounted on the first die paddle portion, while a VCSEL is mounted on the second die paddle portion. The third die paddle portion serves as a floating die paddle portion solely for routing electrical signals and accordingly does not support any active component, such as an integrated circuit. Electrical connections between the first die paddle portion and the second die portion may be made by way of the third die paddle portion.

In step 608, electrical connections are formed between lead frame portions. In one embodiment, leads may be attached to die paddle portions using wires formed by wire bonding. For example, a lead may be wire bonded to a bond pad on a component of a die paddle portion. Interconnections between die paddle portions may also be formed by wire bonding. Other interconnection techniques may also be used without detracting from the merits of the present invention.

In step 610, the front and the back of the lead frame are encapsulated. In one embodiment, the encapsulation is made by molding the front and the back of the lead frame using molding compound. The molding compound buries the thinned portions on the back of the lead frame for electrical isolation while leaving the non-thinned portions exposed. Leads of the first, second, and third die paddle portions may be exposed on the sides of the mold.

In step 612, the top and sides of the encapsulated lead frame are covered with an electrically insulating cover to protect exposed metallic portions on the top and sides of the encapsulated lead frame from erroneous electrical contact and ESD damage.

In step 614, the packaged device comprising the encapsulated lead frame covered by the cover is mounted on a substrate, such as a printed circuit board, for example.

Improved integrated circuit packaging techniques have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of packaging an integrated circuit in a packaging structure, the method comprising:

thinning a first lead in a lead frame to a first thickness that is thinner than an initial thickness of the lead frame, the lead frame including a first die paddle and a second die paddle;

thinning at least a portion of the second die paddle to a second thickness thinner than the initial thickness of the lead frame;

mounting a first component on the first die paddle and a second component on at least the portion of the second die paddle, wherein the second component comprises a vertical cavity surface emitting laser (VCSEL);

coupling the first component with the second component through an interconnect configured to route electrical signals between the first component and the second component; and forming an electrically insulating packaging material over the lead frame and the interconnect such that:
 a thinned portion of the first lead is encapsulated by the packaging material and the thinned portion of the first or second die paddle is electrically insulated from a lower surface of the packaging structure by the packaging material; and
 at least a portion of a second lead of the lead frame is exposed to form an external electrical connection through the packaging material, wherein the interconnect does not comprise the second lead.

2. A method according to claim 1 wherein forming an electrically insulating packaging material over the lead frame comprises forming an electrically insulating packaging material over the lead frame such that at least a portion of the first die paddle is exposed through the lower surface of the packaging structure.

3. A method according to claim 1 wherein the coupling of the first component with the second component through the interconnect comprises wire bonding.

4. A method according to claim 1 wherein the first and second die paddles are physically separate.

5. A method according to claim 1 wherein thinning the first lead and at least the portion of the second die paddle comprises etching the lead frame, and wherein etching the lead frame comprises physically separating the first and second die paddles.

6. A method according to claim 1 wherein thinning the first lead and at least the portion of the second die paddle comprises thinning the first lead and at least the portion of the second die paddle to substantially the same thickness.

7. A method according to claim 1 wherein the first thickness and the second thickness are half of the initial thickness of the lead frame.

8. A method according to claim 1 wherein the mounting of the first component on the first die paddle comprises mounting an integrated circuit die on the first die paddle.

9. A method according to claim 1 further comprising placing an electrically insulating cover over the encapsulated lead frame to cover and provide electrical isolation to a top and sides of the encapsulated lead frame.

10. A method of packaging an integrated circuit, the method comprising:
 thinning at least a portion of a first set of leads in a lead frame to a thickness that is thinner than an initial thickness of the lead frame, the lead frame including a plurality of leads, a first die paddle portion and a second die paddle portion;
 thinning the second die paddle portion to the thickness that is thinner that the initial thickness of the lead frame;
 mounting a first component on the first die paddle;

mounting a second component on the second die paddle, wherein the second component comprises a vertical cavity surface emitting laser (VCSEL);

coupling the first component with the second component through an interconnect configured to route electrical signals between the first component and the second component; and forming an electrically insulating packaging material over the lead frame and the interconnect such that thinned portions of the first set of leads are encapsulated by the packaging material and the second die paddle is electrically insulated from a lower surface of the packaging material, and such that at least a portion of a second set of leads in the plurality of leads are exposed to form external electrical connections through the packaging material and the first die paddle portion is exposed through the lower surface of the packaging structure, wherein the interconnect is formed without at least the portion of the second set of leads.

11. A method according to claim 10 further comprising wire bonding the first component with the second component.

12. A method according to claim 10 wherein the thickness is half of the initial thickness of the lead frame.

13. A method according to claim 10 wherein the packaging material comprises molding compound.

14. A method according to claim 10 wherein the first component comprises an integrated circuit die.

15. A method according to claim 10 further comprising placing an electrically insulating cover over the encapsulated lead frame to cover and provide electrical isolation to a top and sides of the encapsulated lead frame.

16. A method of packaging an integrated circuit in a packaging structure, the method comprising:
 thinning a first set of leads in a lead frame including a plurality of leads, a first die paddle and a second die paddle, to a first thickness that is thinner than an initial thickness of the lead frame;
 thinning at least a portion of one of the first die paddle and second die paddle to a second thickness that is thinner than the initial thickness of the lead frame, wherein the first die paddle is insulated from the second die paddle;
 mounting a first component on the first die paddle and a second component on the second die paddle, wherein the mounting of the second component on the second die paddle comprises mounting a vertical cavity surface emitting laser (VCSEL) on the second die paddle;
 coupling the first component with the second component through an interconnect comprising a third die paddle, the interconnect configured to route electrical signals between the first component and the second component; and
 forming an electrically insulating packaging material over the lead frame such that thinned portions of the first set of leads the third die paddle and the interconnect are encapsulated by the packaging material and the thinned portion of the first or second die paddle is electrically insulated from a lower surface of the packaging structure by the packaging material.

17. The method of claim 16, wherein the first die paddle and the second die paddle are insulated from each other at least one of mechanically and electrically.

* * * * *